United States Patent
Song

(10) Patent No.: US 12,489,083 B2
(45) Date of Patent: Dec. 2, 2025

(54) 3D LAMINATED CHIP, AND SEMICONDUCTOR PACKAGE INCLUDING THE 3D LAMINATED CHIP

(71) Applicant: SAMSUNG ELECTRONICS CO., LTD., Suwon-si (KR)

(72) Inventor: Eunseok Song, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 460 days.

(21) Appl. No.: 17/743,819

(22) Filed: May 13, 2022

(65) Prior Publication Data

US 2023/0101041 A1   Mar. 30, 2023

(30) Foreign Application Priority Data

Sep. 13, 2021   (KR) ................. 10-2021-0122071

(51) Int. Cl.
*H01L 25/065* (2023.01)
*H01L 23/00* (2006.01)
*H01L 25/18* (2023.01)

(52) U.S. Cl.
CPC .......... *H01L 25/0652* (2013.01); *H01L 24/08* (2013.01); *H01L 25/18* (2013.01); *H01L 2224/08145* (2013.01); *H01L 2225/06513* (2013.01); *H01L 2225/06541* (2013.01); *H01L 2924/1205* (2013.01); *H01L 2924/1431* (2013.01); *H01L 2924/1434* (2013.01)

(58) Field of Classification Search
CPC ................. H01L 25/0652; H01L 24/08; H01L 2224/08145; H01L 2225/06541; H01L 2924/1205; H01L 2924/1431; H01L 2924/1434; H01L 25/18; H01L 2225/06513

See application file for complete search history.

(56) References Cited

U.S. PATENT DOCUMENTS

| | | |
|---|---|---|
| 9,312,149 B2 | 4/2016 | Lin et al. |
| 10,068,879 B2 | 9/2018 | Gowda |
| 10,431,517 B2 | 10/2019 | Wuu et al. |
| 10,727,204 B2 | 7/2020 | Agarwal et al. |
| 11,011,495 B2 | 5/2021 | Bhagavat et al. |
| 2013/0127050 A1 | 5/2013 | Miyagawa et al. |
| 2017/0373037 A1* | 12/2017 | Yu ................ H10N 70/826 |
| 2018/0068978 A1* | 3/2018 | Jeng ................ H01L 25/50 |
| 2018/0138101 A1* | 5/2018 | Yu ................ H01L 23/481 |
| 2020/0152602 A1 | 5/2020 | Wei et al. |
| 2020/0343218 A1 | 10/2020 | Hu et al. |
| 2021/0151409 A1 | 5/2021 | Chew |

(Continued)

OTHER PUBLICATIONS

Office Action dated Jul. 8, 2025 issued in corresponding Korean Patent Application No. 10-2021-0122071.

*Primary Examiner* — Thanh Y. Tran
(74) *Attorney, Agent, or Firm* — Morgan, Lewis & Bockius LLP

(57) ABSTRACT

A three-dimensional (3D) laminated chip that includes a first semiconductor chip including a first through electrode disposed therein. A second semiconductor chip is arranged horizontally adjacent to the first semiconductor chip. A third semiconductor chip is arranged on the first semiconductor chip and the second semiconductor chip. A size of the third semiconductor chip is greater than a size of the first semiconductor chip.

17 Claims, 13 Drawing Sheets

(56) References Cited

U.S. PATENT DOCUMENTS

| | | |
|---|---|---|
| 2021/0159213 A1 | 5/2021 | Kim et al. |
| 2021/0193581 A1 | 6/2021 | Seo et al. |
| 2022/0093564 A1* | 3/2022 | Chen .................. H01L 25/18 |
| 2022/0223543 A1* | 7/2022 | Choi .................. H01L 25/0652 |
| 2022/0352138 A1* | 11/2022 | Choi .................. H01L 24/16 |

* cited by examiner

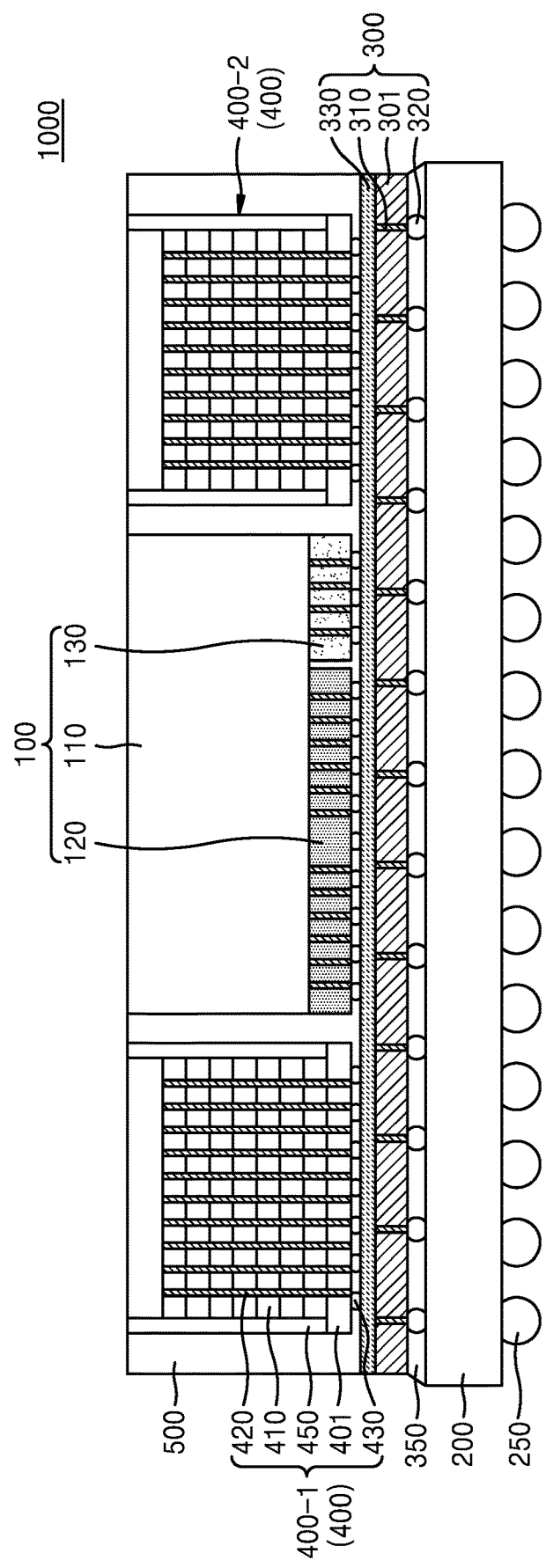

US 12,489,083 B2

3D LAMINATED CHIP, AND SEMICONDUCTOR PACKAGE INCLUDING THE 3D LAMINATED CHIP

CROSS-REFERENCE TO RELATED APPLICATION

This application claims priority under 35 U.S.C. § 119 to Korean Patent Application No. 10-2021-0122071, filed on Sep. 13, 2021 in the Korean Intellectual Property Office, the disclosure of which is incorporated by reference in its entirety herein.

1. TECHNICAL FIELD

The present inventive concept relates to a semiconductor package, and more particularly, to a laminated chip having a structure in which a large-sized semiconductor chip and a small-sized semiconductor chip are laminated, and a semiconductor package including the laminated chip.

2. DISCUSSION OF RELATED ART

Electronic devices become increasingly miniaturized and lightened as the electronic industry has developed and in accordance with user demands. Semiconductor packages applied in electronic devices have also become increasingly miniaturized and lightened. The semiconductor packages should also be highly reliable with high performance and large capacity.

A through silicon via (TSV) structure and a semiconductor package in which these semiconductor chips are laminated have been developed to provide increased miniaturization, a light weight, high performance, large capacity and high reliability.

SUMMARY

The present inventive concept relates to a three-dimensional (3D) laminated chip having a structure in which thermal characteristics of a high-power, high-performance logic chip having a large size may be increased, and a semiconductor package including the 3D laminated chip.

Furthermore, the objective for which the technical idea of the present inventive concept is to be solved is not limited to the above-mentioned tasks, and other objectives may be clearly understood from the following description to those of ordinary skill in the art.

According to one or more embodiments, a three-dimensional (3D) laminated chip includes a first semiconductor chip including a first through electrode disposed therein. A second semiconductor chip is arranged horizontally adjacent to the first semiconductor chip. A third semiconductor chip is arranged on the first semiconductor chip and the second semiconductor chip. A size of the third semiconductor chip is greater than a size of the first semiconductor chip.

According to one or more embodiments, a semiconductor package includes a package substrate. An interposer is arranged on the package substrate. A three-dimensional (3D) laminated chip is arranged on the interposer. The 3D laminated chip comprises a first semiconductor chip including a first through electrode disposed therein, a second semiconductor chip arranged horizontally adjacent to the first semiconductor chip, and a third semiconductor chip arranged on the first semiconductor chip and the second semiconductor chip. A size of the third semiconductor chip is greater than a size of the first semiconductor chip.

According to one or more embodiments, a semiconductor package includes a package substrate. An interposer is arranged on the package substrate. A three-dimensional (3D) laminated chip is arranged on a central portion of the interposer. A High Bandwidth Memory (HBM) chip is arranged on an outer periphery of the interposer on both sides of the 3D laminated chip. The 3D laminated chip comprises a first semiconductor chip arranged on the interposer, a second semiconductor chip arranged on the interposer adjacent to the first semiconductor chip, and a third semiconductor chip arranged on the first semiconductor chip and the second semiconductor chip. A size of the third semiconductor chip is greater than a size of the first semiconductor chip.

BRIEF DESCRIPTION OF THE DRAWINGS

Embodiments of the present inventive concept will be more clearly understood from the following detailed description taken in conjunction with the accompanying drawings in which:

FIG. 7B is a cross-sectional view of a semiconductor package including a 3D laminated chip taken along line I-I' of FIG. 7A according to an embodiment of the present inventive concept.

DETAILED DESCRIPTION OF EMBODIMENTS

Figure 1:
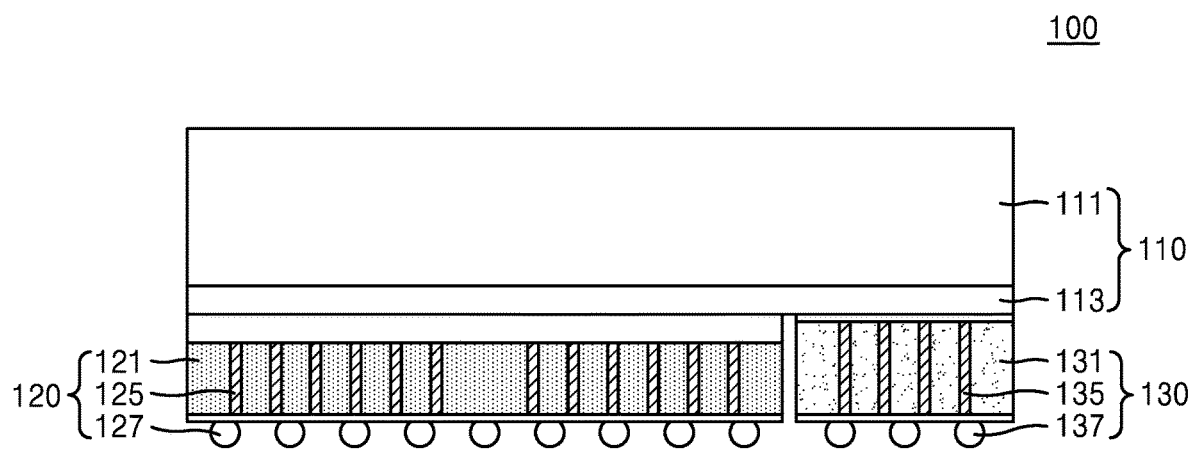
FIG. 1 is a cross-sectional view schematically illustrating a three-dimensional (3D) laminated chip according to an embodiment of the present inventive concept.

Hereinafter, embodiments of the present inventive concept will be described in detail with reference to the accompanying drawings. For the same components on the drawing, the same reference numerals are used, and redundant description thereof may be omitted for convenience of explanation.

Figure 2A:
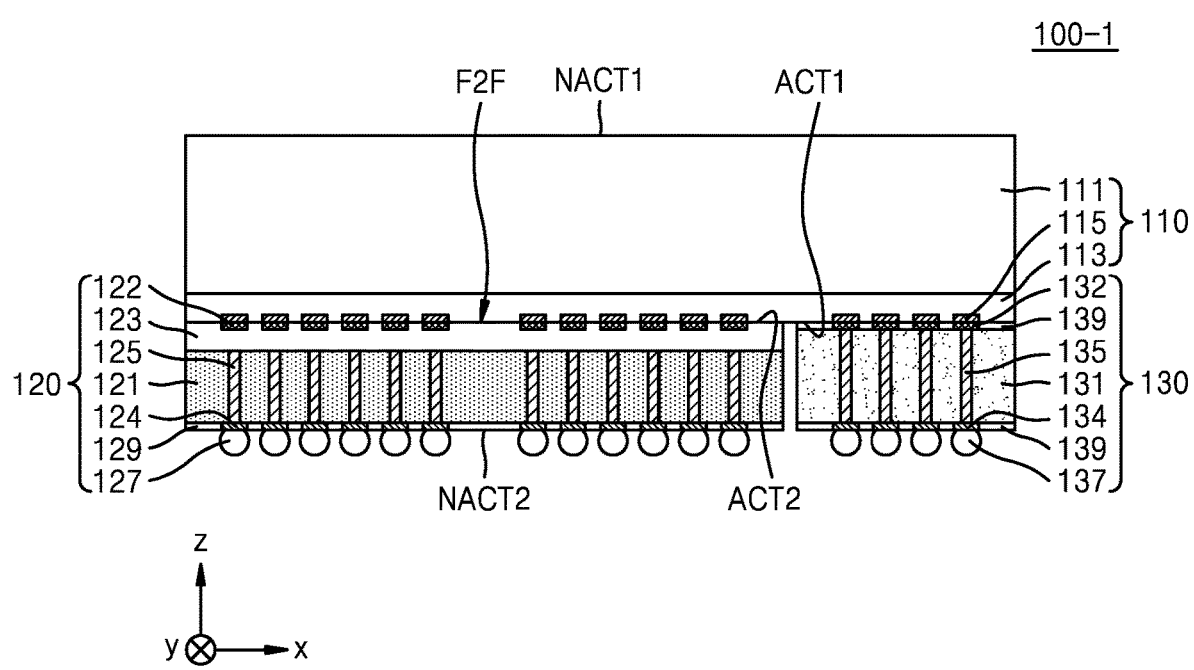
FIGS. 2A through 2C are cross-sectional views illustrating a more detailed bonding structure between an upper semiconductor chip and a lower semiconductor chip in the 3D laminated chip of FIG. 1 according to embodiments of the present inventive concept.
Figure 2B:
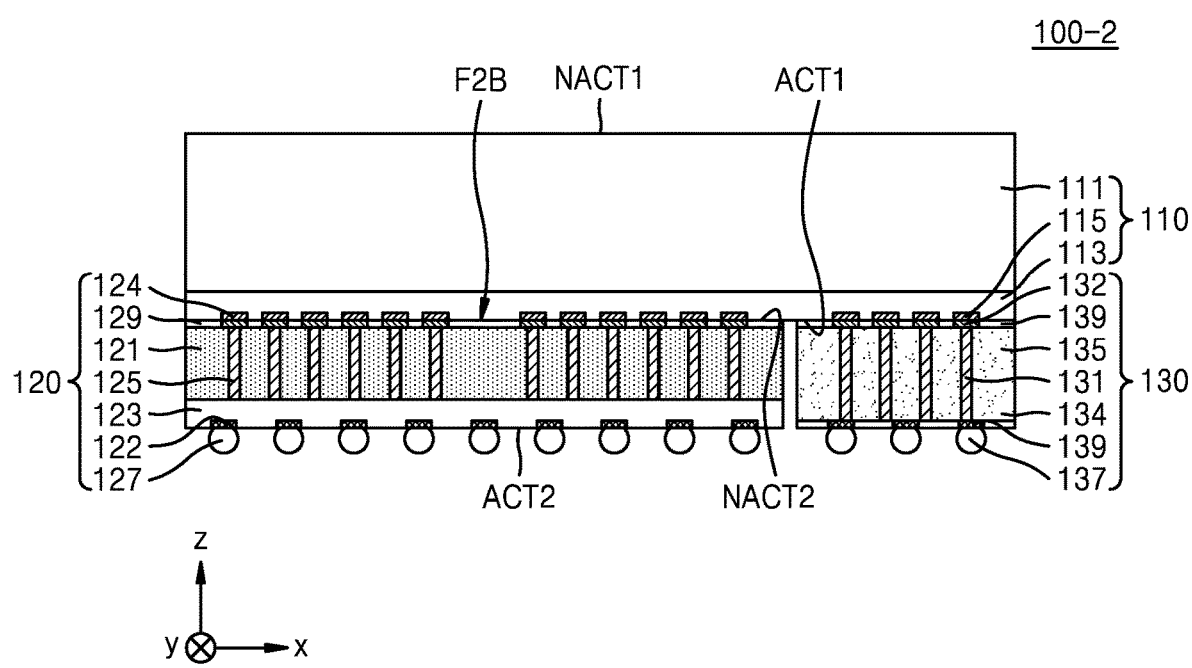
Figure 2C:
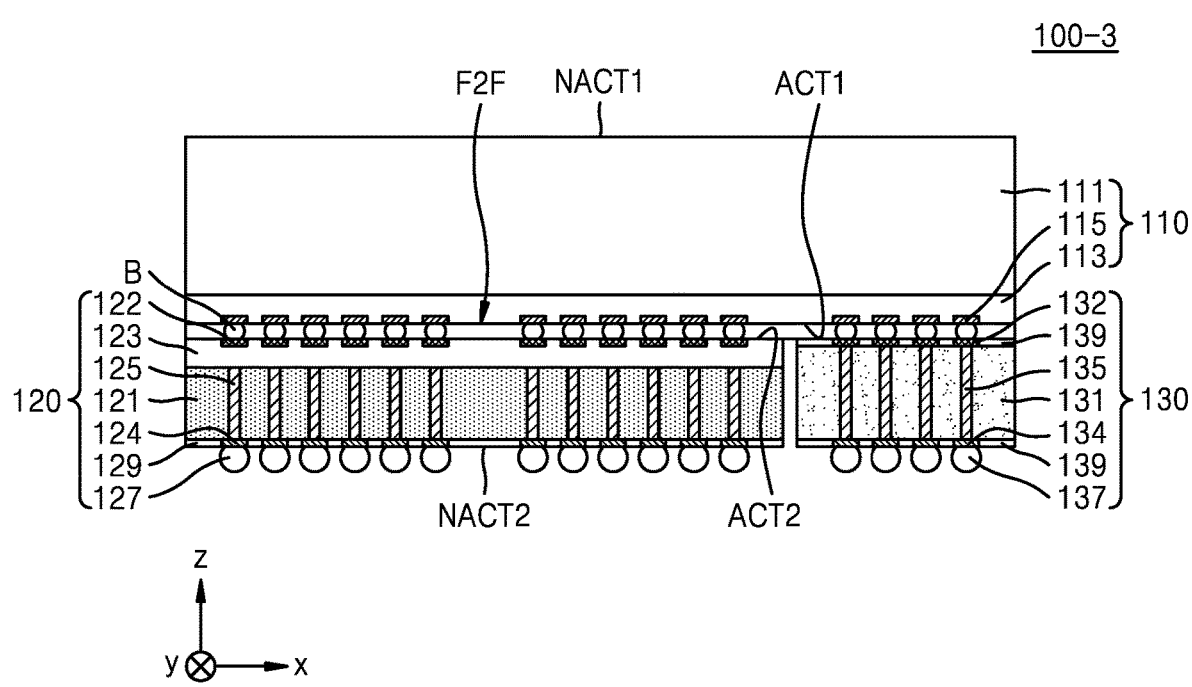

FIG. 1 is a cross-sectional view schematically illustrating a three-dimensional (3D) laminated chip according to an embodiment, and FIGS. 2A through 2C are cross-sectional views illustrating a more detailed bonding structure between an upper semiconductor chip and a lower semiconductor chip in the 3D laminated chip of FIG. 1.

Referring to FIGS. 1 and 2A, a 3D laminated chip 100 or 100-1 according to an embodiment may include an upper semiconductor chip 110, a first lower semiconductor chip 120, and a second lower semiconductor chip 130 that is arranged horizontally adjacent to the first lower semiconductor chip 120. In an embodiment, the upper semiconductor chip 110 may have various bonding structures and may be laminated on the first lower semiconductor chip 120 and the second lower semiconductor chip 130. For example, the upper semiconductor chip 110 may have three bonding structures and may be laminated on the first lower semiconductor chip 120 and the second lower semiconductor chip 130, as shown in FIGS. 2A through 2C. Thus, in FIG. 1, the structure of the 3D laminated chip 100 is schematically illustrated to encompass three bonding structures. Hereinafter, even in the drawings for 3D laminated chips according other embodiments, the structures of the 3D laminated chips are schematically illustrated to encompass three bonding structures.

In an embodiment, the upper semiconductor chip 110 may be a logic chip. However, embodiments of the present inventive concept are not necessarily limited thereto. Thus, the upper semiconductor chip 110 may include a plurality of logic elements therein. In an embodiment, the plurality of logic elements may include, for example, AND, NAND, OR, NOR, exclusive OR (XOR), exclusive NOR (XNOR), inverter INV, adder (ADD), delay DLY, filter FIL, multiplexer MXT/MXIT, OR/AND/INVERTER (OAI), AND/OR (AO), AND/OR/INVERTER (AOI), D-flip-flop, reset flip-flop, master-slave flip-flop, latch, counter, or buffer elements. The logic elements may perform various signal processing such as analog signal processing, analog-to-digital (A/D) conversion, control, and the like. The upper semiconductor chip 110 may refer to a Central Processing Unit (CPU) chip, a Micro-Processor Unit (MPU) chip, a Graphic Processing Unit (GPU) chip, an Application Processor (AP) chip, or a control chip, etc., depending on its function.

The upper semiconductor chip 110 may include a body 111, and a wiring layer 113. In an embodiment, the body 111 may include a semiconductor substrate, an integrated circuit layer, and a interlayer insulating layer. Here, the semiconductor substrate may refer to a silicon substrate. The integrated circuit layer may include logic elements. The wiring layer 113 may include an insulating layer and multi-layered wirings in the insulating layer.

In the upper semiconductor chip 110, a bottom surface of the upper semiconductor chip 110 may be an active surface ACT1, and a top surface of the upper semiconductor chip 110 may be a non-active surface NACT1. A chip pad 115 may be arranged on the bottom surface of the upper semiconductor chip 110. In an embodiment, a protective layer may be arranged on the bottom surface of the upper semiconductor chip 110, and the chip pad 115 may be exposed on the bottom surface of the upper semiconductor chip 110 through the protective layer.

In an embodiment, the first lower semiconductor chip 120 may be a memory chip. However, embodiments of the present inventive concept are not necessarily limited thereto. Thus, the first lower semiconductor chip 120 may include a plurality of memory elements inside. In an embodiment, the plurality of memory elements may include, for example, Dynamic Random Access Memory (DRAM), Static Random Access Memory (SRAM), flash memory, Electrically Erasable and Programmable Read-Only Memory (EEPROM), Phase-Change Random Access Memory (PRAM), Magnetic Random Access Memory (MRAM), or Resistive Random Access Memory (RRAM) elements. However, in other embodiments, the first lower semiconductor chip 120 may be a logic chip. However, even in embodiments in which the first lower semiconductor chip 120 is a logic chip, the size of the first lower semiconductor chip 120 may be less than the size of the upper semiconductor chip 110.

The first lower semiconductor chip 120 may include a body 121, a wiring layer 123, a through electrode 125, and a connection member 127. In an embodiment, the body 121 may include a semiconductor substrate, an integrated circuit layer, and an interlayer insulating layer. Here, the semiconductor substrate may refer to a silicon substrate. In addition, the integrated circuit layer may include the above-described memory elements. The wiring layer 213 may include an insulating layer and multi-layered wirings in the insulating layer.

A chip pad 122 may be arranged on the top surface of the first lower semiconductor chip 120, and a lower pad 124 may be arranged on the bottom surface of the first lower semiconductor chip 120. The lower pad 124 may be exposed through the protective layer 129 on the bottom surface of the first lower semiconductor chip 120.

The through electrode 125 may extend through the body 121 of the first lower semiconductor chip 120. Since the body 121 includes silicon, the through electrode 125 may be referred to as a TSV. In an embodiment, in the through electrode 125, the through electrode 125 may be formed in a Via-middle structure in the 3D laminated chip 100-1 of the embodiment. However, embodiments of the present inventive concept are not necessarily limited thereto, and the through electrode 125 may be formed in a via-first or via-last structure. Here, the via-first structure may refer to a structure in which a through electrode is formed before an integrated circuit layer is formed, and the via-middle structure may refer to a structure in which the through electrode is formed before a wiring layer is formed after the integrated circuit layer is formed, and the via-last structure may refer to a structure in which the through electrode is formed after a wiring layer is formed. In the laminated chip 100-1 according to an embodiment, the through electrode 125 may extend to the wiring layer 123 through the body 121 based on the via-middle structure.

In an embodiment, the through electrode 125 may have a columnar shape and may include a barrier layer on the outer surface of the through electrode 125 and a buried conductive layer inside the through electrode 125. In an embodiment, the barrier layer may include at least one material selected from the group consisting of titanium (Ti), titanium nitride (TiN), tantalum (Ta), tantalum nitride (TaN), ruthenium (Ru), cobalt (Co), manganese (Mn), tungsten nitride (WN), nickel (Ni), and nickel boron (NiB). The buried conductive layer may include at least one material selected from the group consisting of copper (Cu), a Cu alloy such as copper tin (CuSn), copper magnesium (CuMg), copper nickel (CuNi), copper zinc (CuZn), copper palladium (CuPd), copper gold (CuAu), copper rhenium (CuRe), copper tungsten (CuW), or the like, tungsten (W), a W alloy, Ni, ruthenium (Ru), and Co. On the other hand, in an embodiment, a via insulating layer may be disposed between the through electrode 125 and the body 121. The via insulating layer may include, for example, an oxide layer, a nitride layer, a carbide layer, polymer, or a combination thereof.

The through electrode 125 may be connected to the lower pad 124 on the bottom surface of the first lower semiconductor chip 120 and connected to the chip pad 122 on the top surface of the first lower semiconductor chip 120. The through electrode 125 may be connected to the chip pad 122 through the wiring layer 123. For example, in an embodiment, the through electrode 125 may directly connect to the chip pad 122 through the wiring layer 123. Memory elements of the first lower semiconductor chip 120 may be connected to logic elements of the upper semiconductor chip 110 by the through electrode 125 and/or the wiring layer 123.

The connection member 127 may be arranged on the lower pad 124. The through electrode 125 may be connected to the connection member 127 through the lower pad 124. In an embodiment, the connection member 127 may include a conductive material, such as Cu, aluminum (Al), silver (Ag), Sn, Au, solder, and the like. However, the material of the connection member 127 is not limited thereto. On the other hand, in an embodiment, the connection member 127 may be formed as a multilayer or a single layer. For example, in an embodiment in which the connection member 127 is formed as a multilayer, the connection member 127 may include a copper pillar and a solder. In an embodiment in which the connection member 127 is formed as a single layer, the connection member 127 may include a Sn—Ag solder or copper. The connection member 127 may be referred to as a bump.

In an embodiment, the second lower semiconductor chip 130 may be a dummy chip. Thus, the second lower semiconductor chip 130 may not include an integrated circuit such as a memory device or a logic element in the second lower semiconductor chip 130. In an embodiment, the second lower semiconductor chip 130 may include a body 131, a through electrode 135, and a connection member 137. In some embodiments, however, the second lower semiconductor chip 130 may further include a wiring layer, similar to the first lower semiconductor chip 120. The body 131 may include a semiconductor substrate, such as a silicon substrate, and may not include separate integrated circuits. On the other hand, in some embodiments, the body 131 may include a capacitor.

The through electrode 135 may be connected to the lower pad 134 on the lower surface of the second lower semiconductor chip 130 and connected to the chip pad 132 on the top surface of the second lower semiconductor chip 130. In an embodiment in which the second lower semiconductor chip 130 includes a wiring layer, the through electrode 135 may penetrate the body 131 to extend to the wiring layer, and may be connected to the chip pad 132 through the wiring layer. The through electrode 135 may be connected to the connection member 137 through the lower pad 134. Thus, the connection member 137 may be connected to the logic elements of the upper semiconductor chip 110 by the through electrode 135.

In the 3D laminated chip 110-1 of the embodiment, the size (e.g., area) of the upper semiconductor chip 110 may be greater than the size (e.g., area) of the first lower semiconductor chip 120 or the second lower semiconductor chip 130. For example, the upper semiconductor chip 110 may have a size that is greater than or equal to a size obtained by adding the size of the first lower semiconductor chip 120 and the size of the second lower semiconductor chip 130 to each other. For example, the width of a first direction (x-direction) of the upper semiconductor chip 110 may be similar to or slightly greater than a size obtained by adding the width of the first direction (x-direction) of the first lower semiconductor chip 120 and the width of the first direction (x-direction) of the second lower semiconductor chip 130. Also, the width of a second direction (y-direction) of the upper semiconductor chip 110 may be similar to or slightly greater than a size obtained by adding the width of the second direction (y-direction) of the first lower semiconductor chip 120 and the width of the second direction (y-direction) of the second lower semiconductor chip 130.

The consumption power of a logic chip of High Performance Computing (HPC)/server-oriented products is continuously increasing, and a die size is increased to implement high performance logic functions, so that 3D IC or logic chiplet technology is being highlighted. Here, the 3D IC may mean that the memory chip and the logic chip are combined together such as the structure of the 3D laminated chip 100-1 and may be used as a single integrated chip. In addition, the logic chiplet refers to a semiconductor chip that is distinguished according to the size and function of a device, and may be used in the same sense substantially with the 3D IC. In addition, the demand for a 3D package that laminates logic chips and memory chips in 3D is increasing to implement high performance of a system. The performance to be considered in the 3D package is power delivery, thermal properties, cost, and the like, and increasing the thermal characteristics of the 3D package in view of the high power of the logic chips. In a semiconductor package according to the related art, the logic chip may be generally arranged on a lower portion of the semiconductor package to secure the power delivery characteristics of a logic chip having a large size, and a memory chip having a small size may be laminated on an upper portion of the semiconductor package. However, in the case of such a structure, because the logic chip is arranged on the lower portion of the semiconductor package, the thermal properties of the logic chip may be decreased.

In the 3D laminated chip 100 of an embodiment of the present inventive concept, the upper semiconductor chip 110 having a large size for increasing the thermal properties, such as a logic chip, may be arranged on an upper portion of the 3D package, and the first lower semiconductor chip 120 having a relatively small size, such as a memory chip, may be arranged on a lower portion of the 3D package so that the thermal properties of the upper semiconductor chip 110 may be increased. However, when a large-size semiconductor chip is arranged on the upper portion of the 3D package, the reliability for the laminated structure may be decreased, and when a large-size logic chip is arranged on the upper portion of the 3D package, sufficient wiring needs to be provided due to a large number of external input/output (I/O). In the 3D laminated chip 100 of an embodiment of the present inventive concept, the second lower semiconductor chip 130 corresponding to a dummy chip may be additionally arranged on a lower portion of the 3D laminated chip 100 so that the thermal characteristics of the upper semiconductor chip 110 and the reliability of the laminated structure may be increased. Furthermore, the through electrode 135 may be added to the second lower semiconductor chip 130 to be connected to the external I/Os of the upper semiconductor chip 110 so that wiring may be sufficiently secured. Furthermore, capacitors may be added to the second lower semiconductor chip 130 so that the power delivery characteristics may be further increased together with the through electrode 135.

In addition, the 3D laminated chip 100 may construct GPU/CPU SOC chips depending on the type of the upper semiconductor chip 110. In addition, the 3D laminated chip 100 may be applied to a server semiconductor device or a mobile semiconductor device depending on the type of logic elements included in the upper semiconductor chip 110.

In an embodiment of the 3D laminated chip 100-1, the upper semiconductor chip 110 and the first lower semiconductor chip 120 may have a front-to-front (F2F) bonding structure. As can be seen from FIG. 2A, the F2F bonding structure may refer to a structure in which two semiconductor chips or two wafers are bonded to each other so that active surfaces face each other. Here, the front surface may refer to an active surface, and the active surface may refer to a surface on which elements are formed in a wafer or a semiconductor chip, and may be a side surface on which a chip pad is formed. Thus, in the 3D laminated chip 100-1 of the embodiment, the bottom surface of the upper semiconductor chip 110 may be an active surface ACT1, and the top surface of the upper semiconductor chip 110 may be a non-active surface NACT1, and the top surface of the first lower semiconductor chip 120 may be an active surface ACT2, and the bottom surface of the first lower semiconductor chip 120 may be a non-active surface NACT2.

In the 3D laminated chip 100-1 of an embodiment, the upper semiconductor chip 110 and the first lower semiconductor chip 120 have a F2F bonding structure, and chip pads 115 of the upper semiconductor chip 110 may be pad-to-pad bonded to the corresponding chip pads 122 of the first lower semiconductor chip 120 in a one-to-one arrangement. In an embodiment, the chip pads may generally include Cu. Thus, the pad-to-pad bonding in which chip pads are in direct contact with each other, may refer to Cu-to-Cu bonding.

On the other hand, the F2F bonding may be performed at a wafer level. In this way, technology in which F2F bonding is performed at a wafer level or a structure thereof may be referred to as a wafer on wafer (WoW) technology or a WoW structure. Furthermore, when the semiconductor chip or wafer is laminated through F2F bonding, the pitch of the chip pads used for bonding may be very small. For example, in an embodiment, the chip pads 115 of the upper semiconductor chip 110 or the chip pads 122 of the first lower semiconductor chip 120 may have a pitch in a range of less than about 10 μm. However, the pitch of the chip pads 115 and 122 is not limited to the above numbers.

On the other hand, the second lower semiconductor chip 130 may not include the integrated circuit. Therefore, there may be no distinction between the active surface and the non-active surface. However, in an embodiment in which a wiring layer is formed on the second lower semiconductor chip 130, a side surface on which the wiring layer is formed may correspond to the active surface.

Referring to FIGS. 1 and 2B, a 3D laminated chip 100-2 of an embodiment show in FIG. 2B is different from the 3D laminated chip 100-1 of FIG. 2A. In the 3D laminated chip 100-2 of an embodiment shown in FIG. 2B, the upper semiconductor chip 110 and the first lower semiconductor chip 120 have a front-to-back (F2B) bonding structure. Here, a back surface may refer to a non-active surface and may mean the opposite surface to the front surface. Thus, the F2B bonding structure may refer to a structure in which two semiconductor chips or two wafers are bonded to each other so that an active surface and a non-active surface face each other. Thus, in the 3D laminated chip 100-2 of an embodiment, the bottom surface of the upper semiconductor chip 110 may be an active surface ACT1, and the top surface of the upper semiconductor chip 110 may be a non-active surface NACT1, and the bottom surface of the first lower semiconductor chip 120 may be an active surface ACT2, and the top surface of the first lower semiconductor chip 120 may be a non-active surface NACT2.

The upper semiconductor chip 110 and the second lower semiconductor chip 130 may be similar or substantially identical to the upper semiconductor chip 110 and the second lower semiconductor chip 130 of the 3D laminated chip 100-1 of an embodiment shown in FIG. 2A and a repeated description may be omitted for convenience of explanation. Furthermore, the first lower semiconductor chip 120 may be substantially the same as the first lower semiconductor chip 120 of the 3D laminated chip 100-1 of FIG. 2A with only a difference with respect to the front and back surfaces of the first lower semiconductor chip 120 of the 3D laminated chip 100-1 of FIG. 2A.

In the 3D laminated chip 100-2 of an embodiment, the upper semiconductor chip 110 and the first lower semiconductor chip 120 may be bonded to each other through pad-to-pad bonding in which the chip pads 115 of the upper semiconductor chip 110 and the lower pads 124 of the first lower semiconductor chip 120 are in direct contact with each other. Furthermore, when semiconductor chips are laminated through F2B bonding, the pitch of the chip pads used for bonding may be very small. For example, in an embodiment, the chip pads 115 of the upper semiconductor chip 110 and the lower pads 124 of the first lower semiconductor chip 120 may have a pitch in a range of less than about 10 μm. However, the pitch of the chip pads 115 and the lower pads 124 is not limited to the above numbers.

Referring to FIGS. 1 and 2C, a 3D laminated chip 100-3 of the embodiment is different from the 3D laminated chip 100-1 of an embodiment of FIG. 2A. In the 3D laminated chip 100-3 of an embodiment shown in FIG. 2C, the upper semiconductor chip 110 and the first lower semiconductor chip 120 have a bonding structure using a bonding member B. For example, in the 3D laminated chip 100-3 of an embodiment, the upper semiconductor chip 110 and the first lower semiconductor chip 120 may be bonded using a bonding member B, for example, bumps such as the above-described connection members 127 and 137. In an embodiment of a bonding structure using the bonding member B as shown in FIG. 2C, the upper semiconductor chip 110 and the first lower semiconductor chip 120 may be bonded to each other with a F2F bonding structure. However, embodiments of the present inventive concept are not necessarily limited thereto, and the upper semiconductor chip 110 and the first lower semiconductor chip 120 may be bonded to each other with a F2B bonding structure using the bonding member B in some embodiments.

In an embodiment that includes the bonding structure using the bonding member B as shown in FIG. 2C, the pitch of the chip pads 115 and 122 or the lower pads 124 may be relatively large so as to prevent short defects due to reflow or the like during a bonding process. For example, the pitch of the chip pads 115 and 122 or the lower pads 124 may have a pitch in a range of about 30 μm, for example. However, the pitch of the chip pads 115 and 122 or the lower pads 124 is not limited to the above numbers.

In the 3D laminated chip 100 of an embodiment, the binding structure of the upper semiconductor chip 110 and the first lower semiconductor chip 120 is limited to the bonding structure using the above-described pad-to-pad bonding or using the bonding member B. For example, in an embodiment, the upper semiconductor chip 110 and the first lower semiconductor chip 120 may be bonded to each other with a bonding structure using an anisotropic conductive film (ACF). The ACF may refer to an anisotropic conductive film in which fine conductive particles are mixed with an adhesive resin to be made in a film state and thus electricity flows only in one direction. Here, the one direction may mean the direction in which two chip pads to be connected face each other. In an embodiment, the fine conductive particles may include, for example, nickel (Ni), carbon, solder, and the like. In a bonding structure using such ACF, the upper semiconductor chip 110 and the first lower semiconductor chip 120 may be bonded to each other with a F2F bonding structure of a F2B bonding structure.

In the 3D laminated chip 100 of an embodiment, a first lower semiconductor chip 120 having a small size and the second lower semiconductor chip 130 may be arranged on a lower portion of the 3D package, and the upper semiconductor chip 110 having a large size such as a logic chip may be disposed at an upper portion of the 3D package so that thermal properties of the upper semiconductor chip 110 may be increased. In addition, through additional arrangement of the second lower semiconductor chip 130 that is a dummy chip, even when the size of the first lower semiconductor chip 120, which is a memory chip, is less than the size of the upper semiconductor chip 110, the upper semiconductor chip 110 may be stably and reliably laminated on the first lower semiconductor chip 120 and the second lower semiconductor chip 130. Furthermore, the second lower semiconductor chip 130 may be connected to the upper semiconductor chip 110 by adding a through electrode 135 to the second lower semiconductor chip 130 so that the number of I/Os of the upper semiconductor chip 110 may be sufficiently secured and the power delivery characteristics to the upper semiconductor chip 110 may be increased by the through electrode 135. In an embodiment, a capacitor may be added to the second lower semiconductor chip 130 so that the power delivery characteristics to the upper semiconductor chip 110 may be further increased.

Figure 3:
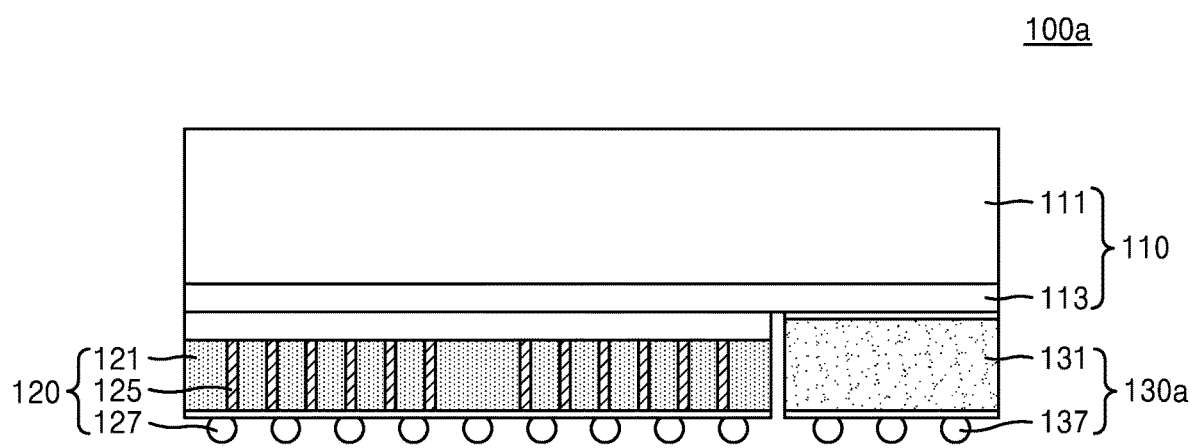
FIGS. 3 and 4 are cross-sectional views illustrating a 3D laminated chip according to embodiments of the present inventive concept.
Figure 4:
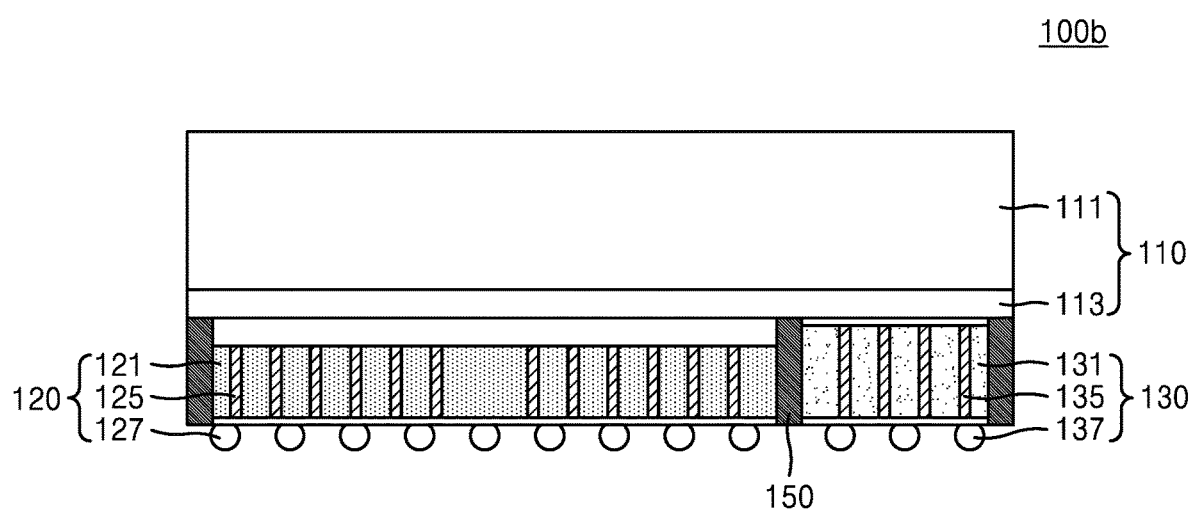

FIGS. 3 and 4 are cross-sectional views schematically illustrating a 3D laminated chip according to embodiments of the present inventive concept. In the description of FIGS. 1 through 2C, the contents of identical or similar elements already described may be briefly described or omitted for convenience of explanation.

Referring to FIG. 3, the 3D laminated chip 100a of an embodiment may be different from the 3D laminated chip 100 of an embodiment shown in FIG. 1 in that the second lower semiconductor chip 130a does not include a through electrode. For example, the 3D laminated chip 100a of an embodiment may include an upper semiconductor chip 110, a first lower semiconductor chip 120, and a second lower semiconductor chip 130a. The upper semiconductor chip 110 and the first lower semiconductor chip 120 may be substantially identical or similar to the upper semiconductor chip 110 and the first lower semiconductor chip 120 of the 3D laminated chip 100 of an embodiment of FIG. 1. The second lower semiconductor chip 130a of an embodiment shown in FIG. 3 may not include a through electrode inside. Thus, the second lower semiconductor chip 130a may support the upper semiconductor chip 110 and contribute to increase the thermal characteristics of the upper semiconductor chip 110.

In the 3D laminated chip 100a of an embodiment, as described in the description of FIGS. 2A through 2C, the upper semiconductor chip 110 and the first lower semiconductor chip 120 may be bonded to each other with a F2F bonding structure or a F2B bonding structure through pad-to-pad bonding, bonding using a bonding member, or bonding using an ACF.

Referring to FIG. 4, the 3D laminated chip 100b of an embodiment may be different from the 3D laminated chip 100 of an embodiment shown in FIG. 1 in that the first lower semiconductor chip 120 and the second lower semiconductor chip 130 are sealed together with a sealing material 150 and are bonded to the upper semiconductor chip 110. For example, the 3D laminated chip 100b of an embodiment may include an upper semiconductor chip 110, a first lower semiconductor chip 120, and a second lower semiconductor chip 130. Furthermore, the first lower semiconductor chip 120 and the second lower semiconductor chip 130 may be sealed together with the sealing material 150.

In an embodiment, the sealing structure of the first lower semiconductor chip 120 and the second lower semiconductor chip 130 may be formed through the following procedure. First, a plurality of first lower semiconductor chips 120 and a plurality of second lower semiconductor chips 130 may be manufactured. Thereafter, the first lower semiconductor chip 120 and the second lower semiconductor chip 130 may be one pair, and a plurality of pairs of the first lower semiconductor chip 120 and the second lower semiconductor chip 130 may be laminated on a support substrate, such as a carrier wafer, and the like. Subsequently, the pairs laminated on the support substrate may be sealed with the sealing material 150 and individualized in individual pairs through a singulation process. Thereafter, the individual pairs may be bonded to the upper semiconductor chip 110.

In the 3D laminated chip 100b of an embodiment shown in FIG. 4, the second lower semiconductor chip 130 may include a through electrode 135. However, embodiments of the present inventive concept are not necessarily limited thereto, and as shown in an embodiment of the 3D laminated chip 100a of FIG. 3, the second lower semiconductor chip 130 may not include a through electrode. Also, in the 3D laminated chip 100b of an embodiment, as described in the description of embodiments shown in FIGS. 2A through 2C, the upper semiconductor chip 110 and the first lower semiconductor chip 120 may be bonded to each other with a F2F bonding structure or a F2B bonding structure through pad-to-pad bonding, bonding using a bonding member, or bonding using an ACF.

Figure 5A:
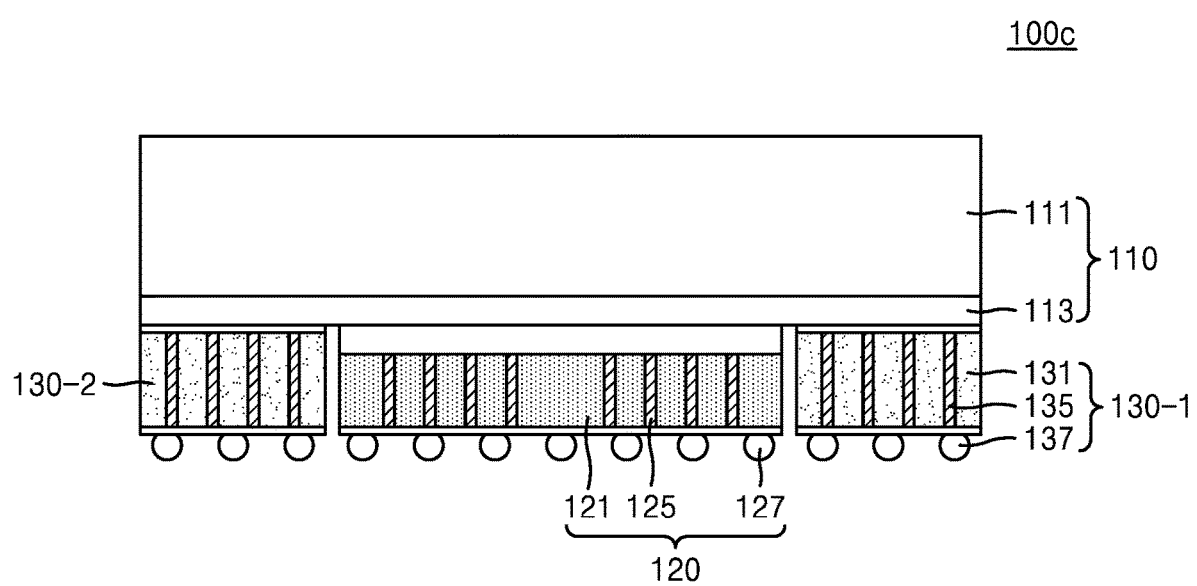
FIGS. 5A and 5B are cross-sectional views illustrating a 3D laminated chip according to embodiments of the present inventive concept.
Figure 5B:
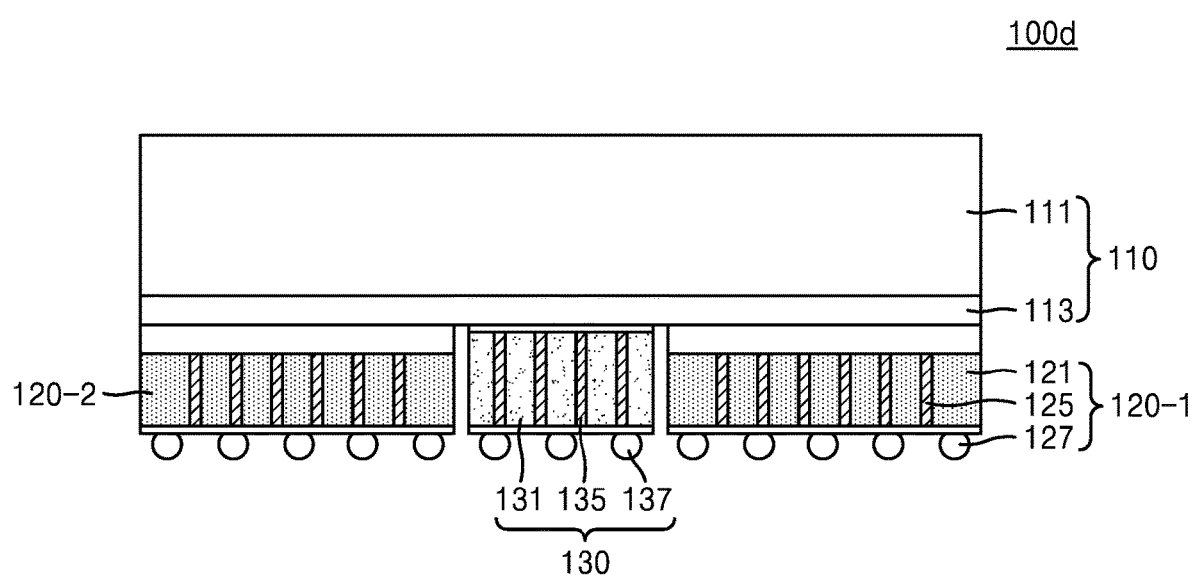

FIGS. 5A and 5B are cross-sectional views schematically illustrating a 3D laminated chip according to embodiments of the present inventive concept. In the description of FIGS. 1 through 4, the contents of similar or substantially identical elements already described may be briefly described or omitted for convenience of explanation.

Referring to FIG. 5A, the 3D laminated chip 100c of an embodiment may be different from the 3D laminated chip 100 of an embodiment shown in FIG. 1 in that the 3D laminated chip 100c includes two second lower semiconductor chips. For example, the 3D laminated chip 100c of an embodiment shown in FIG. 5A may include an upper semiconductor chip 110, a first lower semiconductor chip 120, a right side second lower semiconductor chip 130-1, and a left side second lower semiconductor chip 130-2. The upper semiconductor chip 110 and the first lower semiconductor chip 120 may be substantially identical to the upper semiconductor chip 110 and the first lower semiconductor chip 120 of the 3D laminated chip 100 of an embodiment shown in FIG. 1. However, embodiments of the present inventive concept are not necessarily limited thereto. For example, in some embodiments, the first lower semiconductor chip 120 of the 3D laminated chip 100c shown in an embodiment of FIG. 5A may have a smaller size than the size of the first lower semiconductor chip 120 of the 3D laminated chip 100 of an embodiment shown in FIG. 1.

In an embodiment, both the right side second lower semiconductor chip 130-1 and the left side second lower semiconductor chip 130-2 may be dummy chips. For example, the right side second lower semiconductor chip 130-1 may be arranged on the right of the first lower semiconductor chip 120, and the left side second lower semiconductor chip 130-2 may be arranged on the left of the first lower semiconductor chip 120. In an embodiment, both the right side second lower semiconductor chip 130-1 and the left side second lower semiconductor chip 130-2 may include the through electrode 135. Thus, the right side second lower semiconductor chip 130-1 and the left side second lower semiconductor chip 130-2 may support the upper semiconductor chip 110 and increase the thermal properties of the upper semiconductor chip 110. Furthermore, the number of I/Os of the upper semiconductor chip 110 may be sufficiently secured to increase the power delivery characteristics to the upper semiconductor chip 110. However, embodiments of the present inventive concept are not necessarily limited thereto. For example, in some embodiments, at least one of the right side second lower semiconductor chip 130-1 and the left side second lower semiconductor chip 130-2 may include a capacitor so that the power delivery characteristics of the 3D package may be further increased.

In some embodiments, at least one of the right side second lower semiconductor chip 130-1 and the left side second lower semiconductor chip 130-2 may not include a through electrode. Furthermore, in the 3D laminated chip 100c of an embodiment, the first lower semiconductor chip 120, the right side second lower semiconductor chip 130-1, and the left side second lower semiconductor chip 130-2, as shown in the 3D laminated chip 100b of FIG. 4, may have a structure in which all of these elements are sealed together with a sealing material. Furthermore, in an embodiment of the 3D laminated chip 100c as described in the description of FIGS. 2A through 2C, the upper semiconductor chip 110 and the first lower semiconductor chip 120 may be bonded to each other with a F2F bonding structure or a F2B bonding structure through pad-to-pad bonding, bonding using a bonding member, or bonding using an ACF.

Referring to FIG. 5B, the 3D laminated chip 100d of an embodiment may be different from the 3D laminated chip 100 of an embodiment shown in FIG. 1 in that the 3D laminated chip 100d includes two first lower semiconductor chip 120-1 and 120-2. For example, the 3D laminated chip 100d of an embodiment may include an upper semiconductor chip 110, a right side first lower semiconductor chip 120-1, a left side first lower semiconductor chip 120-2, and a second lower semiconductor chip 130 positioned between the right side first lower semiconductor chip 120-1 and the left side first lower semiconductor chip 120-2. The upper semiconductor chip 110 may be substantially the same as the upper semiconductor chip 110 of the 3D laminated chip 100 of an embodiment shown in FIG. 1.

The right side first lower semiconductor chip 120-1 and the left side first lower semiconductor chip 120-2 may be arranged on both sides of the second lower semiconductor chip 130 arranged in the center thereof. For example, the right side first lower semiconductor chip 120-1 may be arranged on the right of the second lower semiconductor chip 130, and the left side first lower semiconductor chip 120-2 may be arranged on the left of the second lower semiconductor chip 130. On the other hand, the size of the right side first lower semiconductor chip 120-1 and the left side first lower semiconductor chip 120-2 may be less than the size of the first lower semiconductor chip 120 of the 3D laminated chip 100 of FIG. 1. However, embodiments of the present inventive concept are not necessarily limited thereto. For example, in some embodiments, the right side first lower semiconductor chip 120-1 and the left side first lower semiconductor chip 120-2 may also have substantially the same size as the first lower semiconductor chip 120 of the 3D laminated chip 100 of FIG. 1.

In an embodiment, the second lower semiconductor chip 130 may be a dummy chip and may be arranged on the bottom surface of the central portion of the upper semiconductor chip 110. The second lower semiconductor chip 130 may include a through electrode 135. Therefore, the second lower semiconductor chip 130 may support the upper semiconductor chip 110 and increase the thermal properties of the upper semiconductor chip 110, and the number of I/Os of the upper semiconductor chip 110 may be sufficiently secured so that power delivery characteristics to the upper semiconductor chip 110 may be increased. On the other hand, in some embodiments, the second lower semiconductor chip 130 may include a capacitor so that the power delivery characteristics to the upper semiconductor chip 110 may be further increased.

In an embodiment of the 3D laminated chip 100d, the right side first lower semiconductor chip 120-1, the left side first lower semiconductor chip 120-2, and the second lower semiconductor chip 130 may have a structure in which all of these elements are sealed together with a sealing material as shown in the 3D laminated chip 100b of the embodiment of FIG. 4. Also, in the 3D laminated chip 100d of an embodiment, as described in the description of FIGS. 2A through 2C, the upper semiconductor chip 110 and the right first lower semiconductor chip 120-1, and the upper semiconductor chip 110 and the left side first lower semiconductor chip 120-2 may be bonded to each other with a F2F bonding structure or a F2B bonding structure through pad-to-pad bonding, bonding using a bonding member, or bonding using an ACF.

Figure 6A:
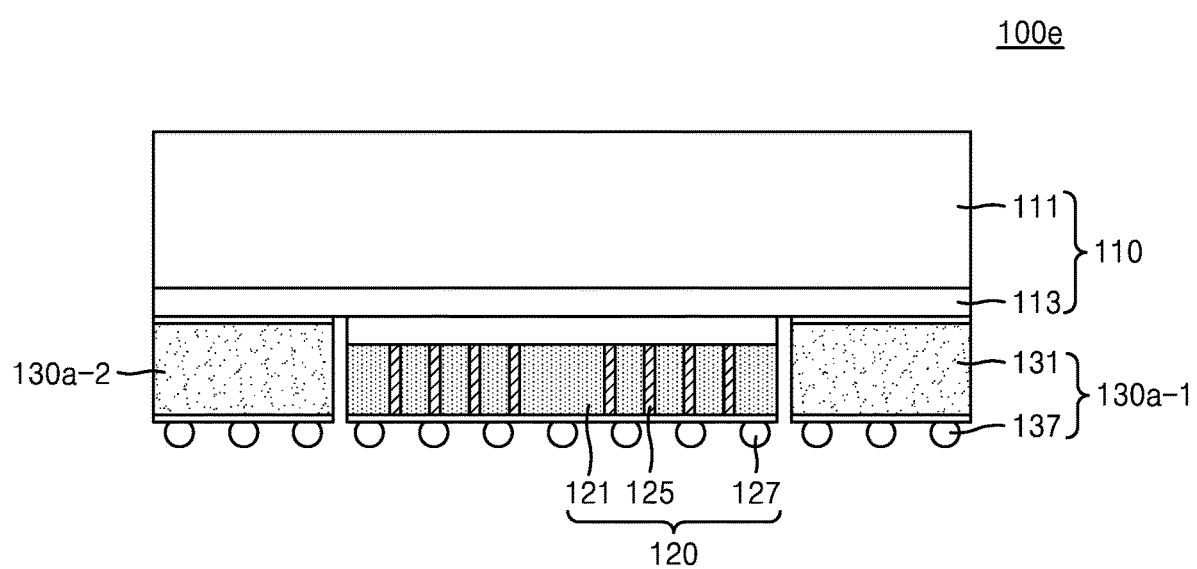
FIGS. 6A and 6B are cross-sectional views schematically illustrating a 3D laminated chip according to embodiments of the present inventive concept.
Figure 6B:
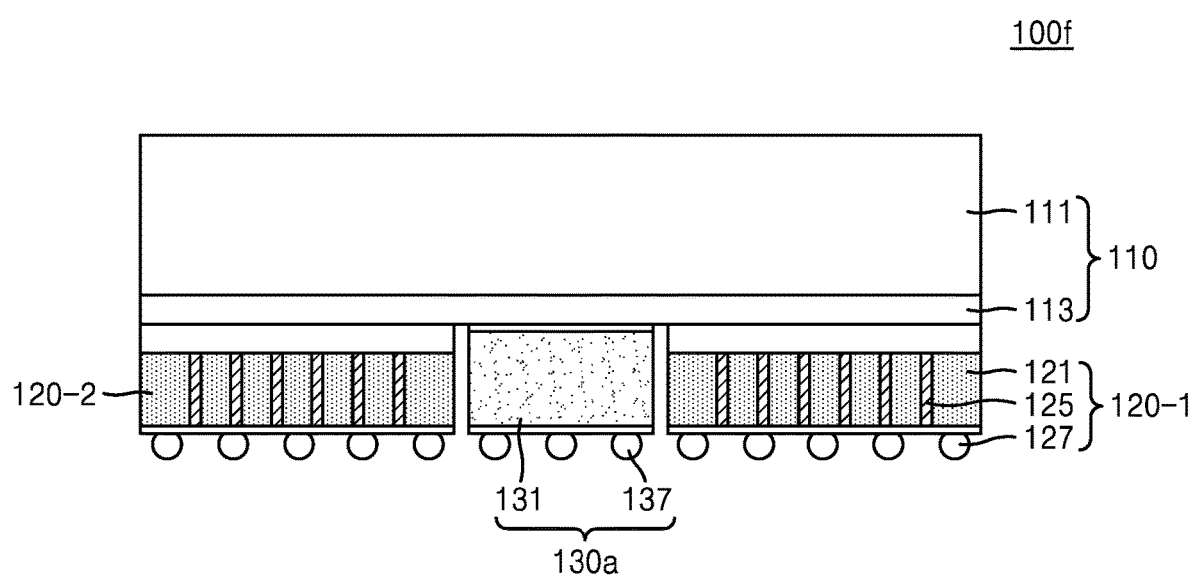

FIGS. 6A and 6B are cross-sectional views schematically illustrating a 3D laminated chip according to embodiments of the present inventive concept. In the description of FIGS. 1 through 5B, the contents of similar or substantially identical elements already described may be briefly described or omitted for convenience of explanation.

Referring to FIG. 6A, a 3D laminated chip 100e of an embodiment may be similar to the 3D laminated chip 100c of an embodiment shown in FIG. 5A in that the 3D laminated chip 100e includes two second lower semiconductor chips 130a-1 and 130a-2. However, the 3D laminated chip 100e of an embodiment shown in FIG. 6A may be different from the 3D laminated chip 100c of an embodiment shown in FIG. 5A in that the second lower semiconductor chips 130a-1 and 130a-2 do not include a through electrode. For example, the 3D laminated chip 100e of an embodiment shown in FIG. 6A may include an upper semiconductor chip 110, a first lower semiconductor chip 120, a right side second lower semiconductor chip 130a-1, and a left side second lower semiconductor chip 130a-2. The upper semiconductor chip 110 and the first lower semiconductor chip 120 may be substantially identical to the upper semiconductor chip 110 and the first lower semiconductor chip 120 of the 3D laminated chip 100 shown in an embodiment of FIG. 1. However, embodiments of the present inventive concept are not necessarily limited thereto. For example, in some embodiments as shown in FIG. 6A, the first lower semiconductor chip 120 may have a size that is less than the size of the first lower semiconductor chip 120 of the 3D laminated chip 100 of an embodiment shown in FIG. 1.

In an embodiment, the right side second lower semiconductor chip 130a-1 and the left side second lower semiconductor chip 130a-2 may be both dummy chips, and the right side second lower semiconductor chip 130a-1 may be arranged on the right of the first lower semiconductor chip 120, and the left side second lower semiconductor chip 130a-2 may be arranged on the left of the first lower semiconductor chip 120. Both the right side second lower semiconductor chip 130a-1 and the left side second lower semiconductor chip 130a-2 may not include a through electrode 135. Thus, the right side second lower semiconductor chip 130a-1 and the left side second lower semiconductor chip 130a-2 may support the upper semiconductor chip 110 and contribute to increasing the thermal characteristics of the upper semiconductor chip 110.

Furthermore, in the 3D laminated chip 100e of an embodiment, the first lower semiconductor chip 120, the right side second lower semiconductor chip 130a-1, and the left side second lower semiconductor chip 130a-2 may have a structure in which all of these elements are sealed together with a sealing material as shown in the 3D laminated chip 100b of an embodiment of FIG. 4. Also, in an embodiment, the upper semiconductor chip 110 and the first lower semiconductor chip 120 of the 3D laminated chip 100e may be bonded to each other with a F2F bonding structure or a F2B bonding structure through pad-to-pad bonding, bonding using a bonding member, or bonding using an ACF as described in the description of embodiments shown in FIGS. 2A through 2C.

Referring to FIG. 6B, a 3D laminated chip 100f of an embodiment may be similar to the 3D laminated chip 100d of an embodiment shown in FIG. 5B in that the 3D laminated chip 100f includes two first lower semiconductor chips 120-1 and 120-2. However, the 3D laminated chip 100f of an embodiment may be different from the 3D laminated chip 100d of FIG. 5B in that the second lower semiconductor chip 130a does not include a through electrode. For example, the 3D laminated chip 100f of an embodiment may include an upper semiconductor chip 110, a right side first lower semiconductor chip 120-1, a left side first lower semiconductor chip 120-2, and a second lower semiconductor chip 130a. The upper semiconductor chip 110 of an embodiment shown in FIG. 6B may be substantially the same as the upper semiconductor chip 110 of the 3D laminated chip 100 of an embodiment shown in FIG. 1.

The right side first lower semiconductor chip 120-1 and the left side first lower semiconductor chip 120-2 may be arranged on both sides of the second lower semiconductor chip 130a arranged in the center thereof. For example, the right side first lower semiconductor chip 120-1 may be arranged on the right of the second lower semiconductor chip 130a, and the left side first lower semiconductor chip 120-2 may be arranged on the left of the second lower semiconductor chip 130a. In an embodiment, the size of the right side first lower semiconductor chip 120-1 and the left side first lower semiconductor chip 120-2 may each be less than the size of the first lower semiconductor chip 120 of the 3D laminated chip 100 of an embodiment shown in FIG. 1. However, embodiments of the present inventive concept are not necessarily limited thereto. For example, in some embodiments, the right side first lower semiconductor chip 120-1 and the left side first lower semiconductor chip 120-2 may also have substantially the same size as the first lower semiconductor chip 120 of the 3D laminated chip 100 of an embodiment shown in FIG. 1.

In an embodiment, the second lower semiconductor chip 130a may be a dummy chip and may be arranged on the bottom surface of the central portion of the upper semiconductor chip 110. In an embodiment, the second lower semiconductor chip 130a may not include a through electrode 135. Thus, the second lower semiconductor chip 130a may support the upper semiconductor chip 110 and contribute to increasing the thermal characteristics of the upper semiconductor chip 110.

In the 3D laminated chip 100f of an embodiment, the right side first lower semiconductor chip 120-1, the left side first lower semiconductor chip 120-2, and the second lower semiconductor chip 130a may have a structure in which all of these elements are sealed together with a sealing material as shown in the 3D laminated chip 100b of an embodiment of FIG. 4. In an embodiment, the upper semiconductor chip 110 and the first lower semiconductor chip 120 of the 3D laminated chip 100f may be bonded to each other with a F2F bonding structure or a F2B bonding structure through pad-to-pad bonding, bonding using a bonding member, or bonding using an ACF as described in the description of embodiments shown in FIGS. 2A through 2C.

Figure 7A:
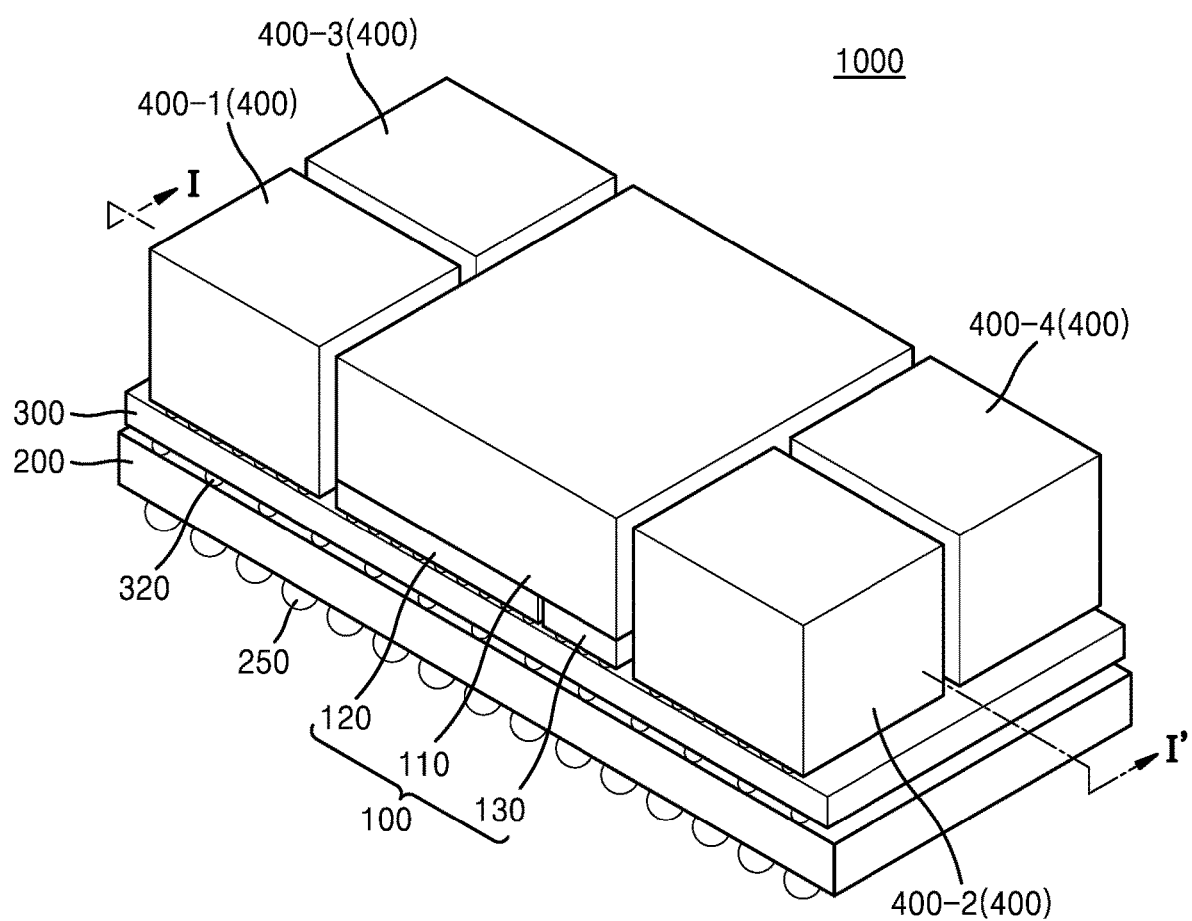
FIG. 7A is a perspective view illustrating a semiconductor package including a 3D laminated chip according to an embodiment of the present inventive concept.

FIGS. 7A and 7B are a perspective view and a cross-sectional view, respectively, of a semiconductor package including a 3D laminated chip according to embodiments of the present inventive concept. FIG. 7B is a cross-sectional view taken along line I-I' of FIG. 7A. In the description of FIGS. 1 through 6B, the contents of similar or substantially identical elements already described may be briefly described or omitted for convenience of explanation.

Referring to FIGS. 7A and 7B, a semiconductor package 1000 (hereinafter, simply referred to as a 'semiconductor package') including the 3D laminated chip of the embodiment may include a 3D laminated chip 100, a package substrate 200, a silicon (Si) interposer 300, an upper semiconductor package 400, and an outer sealing material 500.

In an embodiment, the 3D laminated chip 100 may be the 3D laminated chip 100 of an embodiment shown in FIG. 1. Thus, the 3D laminated chip 100 may include an upper semiconductor chip 110, a first lower semiconductor chip 120, and a second lower semiconductor chip 130. However, in the semiconductor package 1000 of an embodiment, the 3D laminated chip 100 is not limited to the 3D laminated chip 100 of FIG. 1. For example, in the semiconductor package 1000 of an embodiment, instead of the 3D laminated chip 100 of FIG. 1, any one of the 3D laminated chips 100a through 100f of embodiments shown in FIGS. 3 through 6B may be employed as the 3D laminated chip 100. In addition, the 3D laminated chip 100 may construct GPU/CPU SOC chips depending on the type of the upper semiconductor chip 110. Furthermore, depending on the type of the upper semiconductor chip 110 of the 3D laminated chip 100, the semiconductor package 1000 may be distinguished by a server-oriented semiconductor device or a mobile-oriented semiconductor device.

The package substrate 200 may include a wiring of at least one layer therein as a supporting substrate in which the 3D laminated chip 100, the Si interposer 300 and the upper semiconductor package 400 are mounted. In an embodiment in which the wiring is formed as a multilayer, the wiring of the other layer may be connected to each other through a vertical contact. According to an embodiment, the package substrate 200 may include a through electrode for connecting pads on top and bottom surfaces of the package substrate 200. In an embodiment, a protective layer such as a solder resist may be formed on the top and bottom surfaces of the package substrate 200. The pads may be connected to wirings of the wiring layer and exposed from the protective layer. In an embodiment, the package substrate 200 may include, for example, a ceramic substrate, a PCB, an organic substrate, an interposer substrate, and the like. According to an embodiment, the package substrate 200 may be formed of an active wafer such as a silicon wafer. As shown in FIG. 7A, an external connection member 250, such as a bump or solder ball, may be arranged on the bottom surface of the package substrate 200. The external connection member 250 may function to mount the entire semiconductor package 1000 on an external system substrate or a main board.

In an embodiment, the Si interposer 300 may include a substrate 301, a through electrode 310, a connection member 320, and a wiring layer 330. The 3D laminated chip 100 and the upper semiconductor package 400 may be laminated on the package substrate 200 via the Si interposer 300. The Si interposer 300 may electrically connect the 3D laminated chip 100 and the upper semiconductor package 400 to the package substrate 200.

In an embodiment, the substrate 301 of the Si interposer 300 may include, for example, a silicon substrate. Since the substrate 301 of the Si interposer 300 is based on the silicon substrate, the through electrode 310 may correspond to a TSV.

The upper protective layer may be arranged on the top surface of the substrate 301, and an upper pad of the Si interposer 300 may be arranged on the upper protective layer. The upper pad of the Si interposer 300 may be connected to the through electrode 310 through the wiring layer 330. The 3D laminated chip 100 and the upper semiconductor package 400 may be laminated on the Si interposer 300 through the connection members 127, 137, and 430 arranged on the upper pad of the Si interposer 300.

The through electrode 310 may extend through the substrate 301. In addition, the through electrode 310 may extend to the wiring layer 330 and may be electrically connected to the wirings of the wiring layer 330. The structure and material of the through electrode 310 of an embodiment of FIG. 7B may be the same as described for the through electrode 125 of the first lower semiconductor chip 120 in the 3D laminated chip 100 of an embodiment shown in FIG. 1. In an embodiment, the Si interposer 300 may include only a wiring layer inside and may not include a through electrode.

The wiring layer 330 may be arranged on the top surface of the substrate 301 and may include a single layer or a multilayer wiring structure. In an embodiment in which the wiring layer 330 has a multilayer wiring structure, wirings of different layers may be connected to each other via a vertical contact. In some embodiments, the wiring layer 330 may be arranged on the bottom surface of the substrate 301. For example, the positional relationship between the wiring layer 330 and the through electrode 310 may be relative.

The connection member 320 may be arranged on the bottom surface of the Si interposer 300 and electrically connected to the through electrode 310. The Si interposer 300 may be laminated on the package substrate 200 through the connection member 320. The connection member 320 may be connected to the upper pad of the Si interposer 300 by the through electrode 310 and the wirings of the wiring layer 330. In an embodiment, the upper pads used in the power or ground among the upper pads of the Si interposer 300 may be integrated and connected together to the connection member 320. Thus, the number of connection members 320 may be less than the number of upper pads.

In the semiconductor package 1000 of the embodiment, the Si interposer 300 may be used to convert or deliver an input electrical signal between the 3D laminated chip 100, and the upper semiconductor package 400. Thus, the Si interposer 300 may not include elements such as an active element or a passive element. In an embodiment, an underfill 350 may be filled between the Si interposer 300 and the package substrate 200, and between the connection members 320. In some embodiments, the underfill 350 may be replaced by an adhesive film. Furthermore, in an embodiment in which a Molded Underfill (MUF) process is performed on the package substrate 200, the underfill 350 may be omitted.

In an embodiment, four upper semiconductor packages 400 may include first through fourth upper semiconductor packages 400-1 through 400-4, as shown in FIG. 7A, and two of the first through fourth upper semiconductor packages 400-1 through 400-4 may be arranged on the Si interposer 300 on both sides of the 3D laminated chip 100. For example, the 3D laminated chip 100 may be arranged on a central portion of the Si interposer 300 and the first through fourth upper semiconductor packages 400-1 through 400-4 may be arranged on an outer periphery of the Si interposer 300 on both sides of the 3D laminated chip 100. However, in the semiconductor package 1000 of an embodiment, the number of upper semiconductor packages 400 is not limited to four. For example, in some embodiments, one to three or five or more upper semiconductor packages 400 may be arranged on the Si interposer 300.

In an embodiment, the upper semiconductor package 400 may be, for example, a High Bandwidth Memory (HBM) chip. The upper semiconductor package 400 will be described in more detail. In an embodiment, the upper semiconductor package 400 may include a base chip 401 and a plurality of semiconductor chips 410 on the base chip 401, and the base chip 401 and the semiconductor chips 410 may include a through electrode 420 inside. In an embodiment, the uppermost semiconductor chip of the semiconductor chips 410 may not include the through electrode 420.

The base chip 401 may include logic elements. Thus, the base chip 401 may be a logic chip. The base chip 401 may be arranged below the semiconductor chips 410 to integrate the signals of the semiconductor chips 410 and deliver the signals to the outside and may also transmit signals and power from the outside to the semiconductor chips 410. Thus, the base chip 401 may be referred to as a buffer chip or a control chip. In an embodiment, the semiconductor chips 410 may include a plurality of memory elements, such as DRAM elements. The semiconductor chips 410 may be referred to as a memory chip or a core chip. In an embodiment, the semiconductor chips 410 on the base chip 401 may be laminated through the above-mentioned pad-to-pad bonding, bonding using a bonding member, or bonding using an ACF.

A connection member 430 may be arranged on the bottom surface of the base chip 401. The connection member 430 may be connected to the through electrode 420. In an embodiment, the connection member 430 may be formed of a solder ball. However, according to an embodiment, the connection member 430 may have a structure including a pillar and a solder.

The upper semiconductor package 400 may be mounted on the Si interposer 300 via the connection member 430. The semiconductor chips 410 on the base chip 401 may be sealed by an inner sealing material 450. However, in an embodiment as shown in FIG. 7B, the uppermost semiconductor chip of the semiconductor chips 410 may not be covered by the inner sealing material 450. In some embodiments, however, the top surface of the top semiconductor chip 410 may be covered by the inner sealing material 450.

The outer sealing material 500 may cover the side surface and the top surface of the 3D laminated chip 100 and the upper semiconductor package 400 on the Si interposer 300. As shown in an embodiment of FIG. 7B, the outer sealing material 500 may not cover the top surface of the 3D laminated chip 100 and the upper semiconductor package 400. In some embodiments, however, the outer sealing material 500 may cover the top surface of at least one of the 3D laminated chip 100 and the upper semiconductor package 400. In an embodiment, the semiconductor package 1000 may further include a sealing material covering the Si interposer 300 and the outer sealing material 500 on the package substrate 200.

The structure of the semiconductor package 1000 as in an embodiment may be referred to as a 2.5D package structure, and the 2.5D package structure may be a relative concept for a 3D package structure in which all semiconductor chips are laminated together and a SI interposer is not included. Both the 2.5D package structure and the 3D package structure may be included in a System In Package (SIP) structure.

Figure 8:
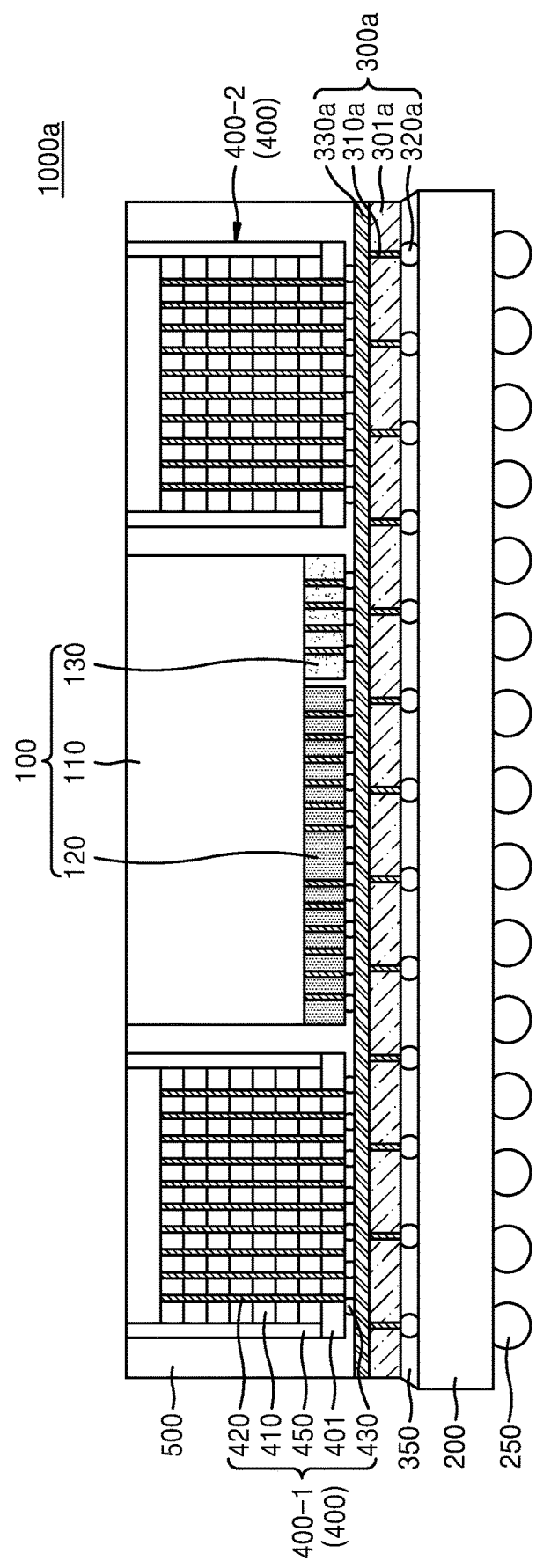
FIG. 8 is a cross-sectional view illustrating a semiconductor package including a 3D laminated chip according to an embodiment of the present inventive concept.

FIG. 8 is a cross-sectional view schematically illustrating a semiconductor package including a 3D laminated chip according to an embodiment. In the description of FIGS. 7A and 7B, the contents of similar or substantially identical elements already described may be briefly described or omitted for convenience of explanation.

Referring to FIG. 8, the semiconductor package 1000a of an embodiment may be different from the semiconductor package 1000 of an embodiment shown in FIG. 7B in that the semiconductor package 1000a includes a Redistribution Layer (RDL) interposer 300a. For example, the semiconductor package 1000a of an embodiment may include a 3D laminated chip 100, a package substrate 200, an RDL interposer 300a, an upper semiconductor package 400, and an outer sealing material 500. The 3D laminated chip 100, the package substrate 200, the upper semiconductor package 400, and the outer sealing material 500 are as described for the semiconductor package 1000 of an embodiment shown in FIG. 7B.

The RDL interposer 300a may include a substrate 301a, a through electrode 310a, a connection member 320a, and a wiring layer 330a. The 3D laminated chip 100 and the upper semiconductor package 400 may be laminated on the package substrate 200 via the RDL interposer 300a. The RDL interposer 300a may electrically connect the 3D laminated chip 100 and the upper semiconductor package 400 to the package substrate 200.

In an embodiment, the substrate 301a of the RDL interposer 300a may be formed of any one of an organic material, an inorganic material, a plastic, a polymer, and a glass substrate. However, the material of the substrate 301a is not limited to the above-described materials. In an embodiment in which the substrate 301a is an organic material substrate, the RDL interposer 300a may be referred to as a panel interposer. In an embodiment, the size of the RDL interposer 300a may be greater than the Si interposer. In addition, the RDL interposer 300a may be fabricated in the form of a coreless substrate to increase the performance by reducing a path on which electricity flows. In an embodiment, the RDL interposer 300a may be manufactured using a sintering process to reduce overheating generated by many data processing.

While the present inventive concept has been particularly shown and described with reference to non-limiting embodiments thereof, it will be understood that various changes in form and details may be made therein without departing from the spirit and scope of the present inventive concept.

What is claimed is:

1. A three-dimensional (3D) laminated chip comprising:
a first semiconductor chip including a first through electrode disposed therein;
a second semiconductor chip arranged horizontally adjacent to the first semiconductor chip; and
a third semiconductor chip arranged on the first semiconductor chip and the second semiconductor chip,
wherein:
a connection member disposed on a bottom surface of the 3D laminated chip and exposed to an external environment,
the first and second semiconductor chips are disposed closer to the bottom surface of the 3D laminated chip than the third semiconductor chip,
a size of the third semiconductor chip is greater than a size of the first semiconductor chip,
the first semiconductor chip is a memory chip or a logic chip;
the second semiconductor chip is a dummy chip that does not include an integrated circuit; and
the third semiconductor chip is a logic chip.

2. The 3D laminated chip of claim 1, wherein the second semiconductor chip has one structure selected from: a first structure wherein a through electrode is not included in the second semiconductor chip, a second structure wherein the second semiconductor chip includes a second through electrode connected to the third semiconductor chip, and a third structure wherein the second semiconductor chip includes the second through electrode and a capacitor.

3. The 3D laminated chip of claim 1, wherein:
the 3D laminated chip further includes a fourth semiconductor chip arranged adjacent to the first semiconductor chip or the second semiconductor chip,
wherein the fourth semiconductor chip is one chip selected from a memory chip, a logic chip and a dummy chip.

4. The 3D laminated chip of claim 1, wherein the first semiconductor chip and the second semiconductor chip are arranged individually on a bottom surface of the third semiconductor chip, or are sealed together with a sealing material and arranged on a bottom surface of the third semiconductor chip.

5. The 3D laminated chip of claim 1, wherein:
an active surface of the third semiconductor chip faces towards the first semiconductor chip; and
the first semiconductor chip is bonded to the third semiconductor chip either with a front-to-back bonding structure having a non-active surface of the first semiconductor chip facing towards the active surface of the third semiconductor chip, or a front-to-front bonding structure having an active surface of the first semiconductor chip facing towards the active surface of the third semiconductor chip.

6. A semiconductor package comprising:
a package substrate;
an interposer arranged on the package substrate; and
a three-dimensional (3D) laminated chip arranged on the interposer,
wherein the 3D laminated chip comprises a first semiconductor chip including a first through electrode disposed therein, a second semiconductor chip arranged horizontally adjacent to the first semiconductor chip, and a third semiconductor chip arranged on the first semiconductor chip and the second semiconductor chip,
wherein:
a connection member disposed on a bottom surface of the 3D laminated chip and exposed to an external environment,
the first and second semiconductor chips are disposed closer to the bottom surface of the 3D laminated chip than the third semiconductor chip,
a size of the third semiconductor chip is greater than a size of the first semiconductor chip, the first semiconductor chip is a memory chip or a logic chip;

the second semiconductor chip is a dummy chip that does not include an integrated circuit; and the third semiconductor chip is a logic chip.

7. The semiconductor package of claim 6, wherein the interposer is a silicon (Si) interposer or a Redistribution Layer (RDL) interposer.

8. The semiconductor package of claim 6, wherein the 3D laminated chip is arranged on a central portion of the interposer, and the semiconductor package further comprises a High Bandwidth Memory (HBM) chip arranged on an outer periphery of the interposer on both sides of the 3D laminated chip.

9. The semiconductor package of claim 6, wherein the second semiconductor chip has one structure selected from: a first structure wherein a through electrode is not included in the second semiconductor chip, a second structure wherein the second semiconductor chip includes a second through electrode connected to the third semiconductor chip, and a third structure wherein the second semiconductor chip includes the second through electrode and a capacitor.

10. The semiconductor package of claim 6, wherein:

the 3D laminated chip further includes a fourth semiconductor chip arranged adjacent to the first semiconductor chip or the second semiconductor chip.

11. The semiconductor package of claim 10, wherein the fourth semiconductor chip is one chip selected from a memory chip, a logic chip, and a dummy chip.

12. The semiconductor package of claim 6, wherein the first semiconductor chip and the second semiconductor chip are arranged individually on the interposer through a bump on a bottom surface of the first semiconductor chip and the second semiconductor chip, or are sealed together with a sealing material and arranged on the interposer through the bump.

13. The semiconductor package of claim 6, wherein an active surface of the third semiconductor chip faces towards the first semiconductor chip; and the first semiconductor chip is bonded to the third semiconductor chip either with a front-to-back bonding structure having a non-active surface of the first semiconductor chip facing towards the active surface of the third semiconductor chip, or a front-to-front bonding structure having an active surface of the first semiconductor chip facing towards the active surface of the third semiconductor chip.

14. A semiconductor package comprising:
a package substrate;
an interposer arranged on the package substrate; and
a three-dimensional (3D) laminated chip arranged on a central portion of the interposer; and
a High Bandwidth Memory (HBM) chip arranged on an outer periphery of the interposer on both sides of the 3D laminated chip,
wherein:
the 3D laminated chip comprises a first semiconductor chip arranged on the interposer, a second semiconductor chip arranged on the interposer adjacent to the first semiconductor chip, and a third semiconductor chip arranged on the first semiconductor chip and the second semiconductor chip,
a connection member disposed on a bottom surface of the 3D laminated chip and exposed to an external environment,
the first and second semiconductor chips are disposed closer to the bottom surface of the 3D laminated chip than the third semiconductor chip,
a size of the third semiconductor chip is greater than a size of the first semiconductor chip,
the first semiconductor chip is a memory chip or a logic chip;
the second semiconductor chip is a dummy chip that does not include an integrated circuit; and
the third semiconductor chip is a logic chip.

15. The semiconductor package of claim 14, wherein the second semiconductor chip has one structure selected from: a first structure wherein a through electrode is not included in the second semiconductor chip, a second structure wherein the second semiconductor chip includes a through electrode connected to the third semiconductor chip, and a third structure wherein the second semiconductor chip includes the through electrode and a capacitor.

16. The semiconductor package of claim 14, wherein:
the first semiconductor chip includes a through electrode disposed therein; and
the 3D laminated chip further includes a fourth semiconductor chip arranged on the interposer and positioned adjacent to the first semiconductor chip or the second semiconductor chip, wherein the fourth semiconductor chip is one chip selected from a memory chip, a logic chip and a dummy chip.

17. The semiconductor package of claim 14, wherein the first semiconductor chip and the second semiconductor chip are arranged individually on the interposer through a bump on a bottom surface of the first semiconductor chip and the second semiconductor chip, or are sealed together with a sealing material and arranged on the interposer through the bump.

* * * * *